(12) United States Patent
Loeher et al.

(10) Patent No.: US 10,903,560 B2
(45) Date of Patent: Jan. 26, 2021

(54) HERMETICALLY SEALED MODULE UNIT WITH INTEGRATED ANTENNAS

(71) Applicant: Fraunhofer-Gesellschaft zur Foerderung der angewandten Forschung e.V., Munich (DE)

(72) Inventors: Thomas Loeher, Berlin (DE); Ivan Ndip, Berlin (DE); Klaus-Dieter Lang, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/380,849

(22) Filed: Apr. 10, 2019

(65) Prior Publication Data
US 2019/0319349 A1 Oct. 17, 2019

(30) Foreign Application Priority Data

Apr. 13, 2018 (DE) .......................... 10 2018 205 670

(51) Int. Cl.
| | |
|---|---|
| *H01Q 1/38* | (2006.01) |
| *H01Q 1/52* | (2006.01) |
| *H01Q 9/04* | (2006.01) |
| *H01Q 1/22* | (2006.01) |

(52) U.S. Cl.
CPC .............. *H01Q 1/38* (2013.01); *H01Q 1/2283* (2013.01); *H01Q 1/526* (2013.01); *H01Q 9/0407* (2013.01)

(58) Field of Classification Search
CPC .......... H01L 2223/6677; H01Q 9/0407; H01Q 1/2283; H01Q 1/38; H01Q 1/526; H01Q 1/243; H01Q 23/00; H01Q 21/065; G06K 19/07775; H04B 1/0458
See application file for complete search history.

(56) References Cited

U.S. PATENT DOCUMENTS

| | | | |
|---|---|---|---|
| 5,219,377 A | 6/1993 | Poradish | |
| 5,898,909 A * | 4/1999 | Yoshihara | ............. H01L 23/552 257/E23.114 |
| 6,236,366 B1 | 5/2001 | Yamamoto et al. | |
| 6,243,040 B1 | 6/2001 | Corey et al. | |

(Continued)

FOREIGN PATENT DOCUMENTS

| | | |
|---|---|---|
| DE | 102017200127 A1 | 7/2018 |
| EP | 1357395 A1 | 10/2003 |

OTHER PUBLICATIONS

Hirachi, Yasutake et al., "A Cost-Effective RF-Module with Built-in Patch Antenna for Millimeter-Wave Wireless Systems", 29th European Microwave Conference, Munich 1999.

*Primary Examiner* — Vibol Tan
(74) *Attorney, Agent, or Firm* — Michael A. Glenn; Perkins Coie LLP

(57) ABSTRACT

A module unit includes a carrier substrate, an antenna substrate as well as sealants. The carrier substrate includes a chip arranged on a first main surface as well as a spacer arranged on the first main surface. The antenna substrate includes at least one antenna structure. The sealants hermetically seal off the antenna substrate and the carrier substrate in an edge area and connect same to each other. The antenna substrate is connected to the carrier substrate via the spacer, so that a cavity is formed between the chip and the antenna substrate.

14 Claims, 3 Drawing Sheets

(56) References Cited

U.S. PATENT DOCUMENTS

| | | | |
|---|---|---|---|
| 6,686,649 B1* | 2/2004 | Mathews | H01L 23/552 |
| | | | 257/659 |
| 8,101,466 B2* | 1/2012 | Yamazaki | H01L 21/76254 |
| | | | 438/113 |
| 9,153,863 B2 | 10/2015 | Nair et al. | |
| 9,490,196 B2* | 11/2016 | Teh | H01L 23/13 |
| 2008/0055185 A1* | 3/2008 | Hogsett | H01Q 1/44 |
| | | | 343/872 |
| 2009/0085819 A1* | 4/2009 | Watanabe | H01Q 1/521 |
| | | | 343/787 |
| 2010/0327068 A1 | 12/2010 | Chen et al. | |
| 2011/0169641 A1* | 7/2011 | Lin | H01L 23/544 |
| | | | 340/572.8 |
| 2013/0321969 A1* | 12/2013 | Chang-Chien | H03G 11/004 |
| | | | 361/112 |
| 2018/0145397 A1* | 5/2018 | Nakagawa | H05K 1/181 |
| 2018/0191052 A1* | 7/2018 | Ndip | H01L 23/552 |
| 2018/0191062 A1* | 7/2018 | Ndip | H01Q 1/40 |
| 2019/0334228 A1* | 10/2019 | Haridas | H01Q 21/0025 |

* cited by examiner

HERMETICALLY SEALED MODULE UNIT WITH INTEGRATED ANTENNAS

CROSS-REFERENCE TO RELATED APPLICATION

This application claims priority from German Patent Application No. DE 10 2018 205 670.6, which was filed on Apr. 13, 2018, and is incorporated herein in its entirety by reference.

Embodiments of the present invention relate to a module unit comprising an antenna substrate, the module unit being hermetically sealed.

BACKGROUND OF THE INVENTION

Hermetically sealed modules comprising integrated antennas have been widely used, e.g., in the field of radar systems. In addition to the actual antenna element, e.g., a patch antenna, such modules frequently also include one or more chips and passive components. Said chips, e.g., HF chips, may be connected to the antenna element in various ways.

For example, U.S. Pat. No. 6,243,040 shows a patch antenna arranged within a lid of a housing, which housing may have the chip provided therein. The housing enables hermetic sealing. Since the antenna element is integrated into the lid, it is not easy to contact. In the application presented here, a bonding wire is used which extends between the antenna element and the chip and projects through the interior of the housing. Using such bonding wires in high-frequency applications is not ideal.

EP 1 357 395 describes a concept wherein the antenna and the chip are arranged on a shared substrate and are integrated into or molded into a shared housing to achieve hermetic sealing. This solution is not ideal with regard to signal feed-out and to the influence that the antenna element and the chip exert on each other. In addition, this structure does not offer the possibility of effectively feeding out thermal energies arising in the HF chip.

U.S. Pat. No. 6,236,366 B1 presents a hermetically sealed chip module which has an HF chip as well as an antenna element provided on a shared carrier substrate (part of the housing and/or part of the sealing). The individual elements are in electrical contact with one another by means of bonding wires. Because of its arrangement, this solution, too, has disadvantages with regard to signal feed-out and to electrical connections of the individual components. Therefore, there is a need for an improved approach.

It is the object of the present invention to provide a concept for a hermetically sealed module unit comprising an integrated antenna, wherein there is an improved compromise between ease of assembly, mutual electrical connections between the individual components, in particular with regard to optimization of the HF properties and a possibility to dissipate heat.

SUMMARY

According to an embodiment, a module unit may have: a carrier substrate including at least one chip arranged on a first main surface and a spacer arranged on the first main surface; an antenna substrate including at least one antenna structure; and sealing means which hermetically seal the antenna substrate, the spacer and the carrier substrate toward an outside; the antenna substrate being connected to the carrier substrate by means of the spacer so that a cavity is formed between the chip and the antenna substrate.

Embodiments of the present invention provide a module unit comprising a carrier substrate and an antenna substrate as well as sealing means. The carrier substrate comprises a chip arranged on a first main surface as well as a spacer arranged on the first main surface. The antenna substrate comprises at least one antenna structure, such as a patch antenna, for example, or several antenna structures. The antenna substrate is connected to the carrier substrate via the spacer such that a cavity, e.g., air cavity, is formed between the chip and the antenna substrate. The sealing means hermetically seal the antenna substrate, the spacer and the carrier substrate toward the outside, e.g., in the area of the edges.

In accordance with embodiments, the carrier substrate and the antenna substrate are arranged as a stack with the interposed spacer, the sealing means being provided in the area of the edges of the stack and thus sealing the interior of the chip arrangement toward the outside.

Embodiments of the present invention are based on the finding that arranging the antenna substrate and the carrier substrate on top of each other enables that the antenna substrate with its one or more antenna elements may be easily contacted by the at least one chip of the carrier substrate, e.g., by means of a via or electromagnetic induction. Since the antenna is arranged within the antenna substrate and since the antenna substrate is located on the outside of the module unit, good signal feed-out may be achieved. Since a cavity is provided between the antenna substrate and/or the antenna structure and the chip, mutual influence may also be minimized. Thus, embodiments advantageously provide a hermetically sealed module which has electromagnetic properties that are optimized both with regard to signal feed-out and to internal wiring, and which can be readily manufactured at low cost.

In accordance with embodiments, the antenna substrate and the carrier substrate are not conductive. In accordance with advantageous embodiments, those two substrates are made of a ceramic material or a glass material. This promotes the antenna properties, on the one hand, and also enables good heat extraction, on the other hand (in particular with thermally highly conductive ceramics).

In accordance with embodiments, the antenna substrate comprises a shielding plane arranged between the antenna structure and the chip. Said shielding plane may be connected to ground of the chip, for example. As was already indicated above, there are different variants for coupling the antenna structure to the chip, such as while using a via or by means of electromagnetic coupling means (e.g., proximity-coupled or aperture-coupled feed). With regard to said coupling means and/or to the physical element of a via it shall be noted that they act through the cavity or through the cavity and the antenna substrate and/or project, for the physical via, through the cavity and/or the antenna substrate.

In accordance with further embodiments, the carrier substrate serves to make contact. This is why the carrier substrate comprises vias or through-connections, so that the module unit may be contacted from a main surface of the carrier substrate that is located opposite to that main surface which has the chip arranged thereon. Here, contact elements such as solder balls, for example, may also be provided on the outside of the module unit. In accordance with further embodiments, the carrier substrate may also comprise vias in the area of the chip for heat dissipation purposes. Said vias project through the carrier substrate and are connected, in accordance with additional embodiments, on the outside of the module unit by means of thermally highly conductive elements such as solder balls, a heat sink or, generally, cooling agents, for example. In accordance with embodiments, the cooling agents form part of the module unit.

As far as the spacer is concerned, it shall be noted that same may be configured, e.g., of a non-conductive material such as an epoxide or a glass fiber-reinforced epoxide and/or, generally, a fastener or a ceramic. Generally, the spacer serves to enable electrical (by means of vias) and mechanical contacting.

In accordance with embodiments, the spacer has at least one, advantageously several, components such as passive elements (resistors, inductances or capacitances) or other active elements (further ICs) embedded therein. In accordance with further embodiments, the spacer is formed by a socket carrying the at least one chip (recess for the chip). Both variants advantageously enable formation of the cavity which is advantageous for the electromagnetic properties of the module unit, in particular feedout of the electromagnetic wave by means of the antenna structure as well as electromagnetic disconnection of the chip and the antenna structure.

As was already explained above, the sealing means serve to achieve hermetic sealing. They may be formed, e.g., by means of edge metallization or by sealings deposited in a different manner.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
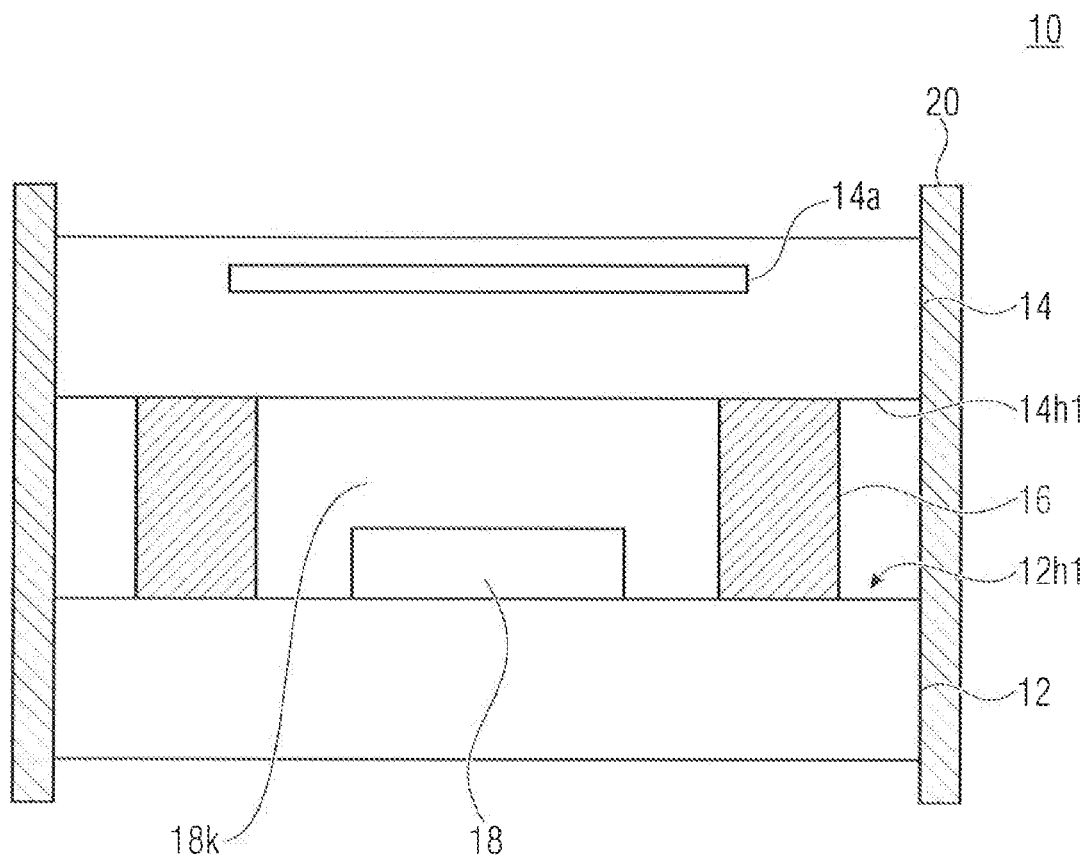
FIG. 1 shows a schematic representation of a module unit in accordance with a basic embodiment.

Before embodiments of the present invention will be explained in more detail with reference to the accompanying drawings, it shall be noted that elements and structures having identical actions are provided with identical reference numerals, so that their respective descriptions are mutually applicable and/or exchangeable.

FIG. 1 shows a module unit 10 comprising a carrier substrate 12 as well as an antenna substrate 14. The carrier substrate 12 and the antenna substrate 14 are arranged in parallel with each other and are connected to each other via a spacer 16.

In detail: The spacer 16 is connected to the carrier substrate 12 via the first main surface area 12h1 (inside of the module unit 10), the antenna substrate 14 being connected to the spacer 16 via the main surface 14h1 (also the inside). The spacer 16 may be a ring, for example, the spacer 16 being depicted in section in the drawing of FIG. 1. Within the spacer 16, which is annular, for example, a chip 18 is provided on the first main surface 12h1 of the carrier substrate 12. In accordance with embodiments, it is also possible for several chips 18 to be arranged inside the module unit 10. As depicted here, the chip 18 is flatter than the spacer 16, so that a cavity 18k forms between the chip 18 and the antenna substrate 14.

Thus, the module unit 10 includes the "stack of layers" consisting of the at least three units of the carrier substrate 12, the antenna substrate 14 and the interposed spacing layer 16. The sides of the layer stack have sealing means provided thereon which here are referred to by the reference numeral 20. Said sealing means 20 may extend around the stack of layers in an annular manner, for example, or may generally extend around the stack of layers, so that the interior of the module 10, e.g., the cavity 18, is hermetically sealed. The sealing means 20 may represent an edge metallization, for example, and serve different purposes. In accordance with a main purpose, hermetic sealing of the edge area of the module unit is effected. By using metal, shielding with regard to electromagnetic radiation may be achieved at the same time. The mechanical connection which is supported here in this area is to be mentioned as the third purpose.

With regard to the antenna substrate 14 it shall be noted at this point that it may comprise either one or more integrated antenna elements 14a or one or more fitted antenna elements 14a.

Figure 2A:
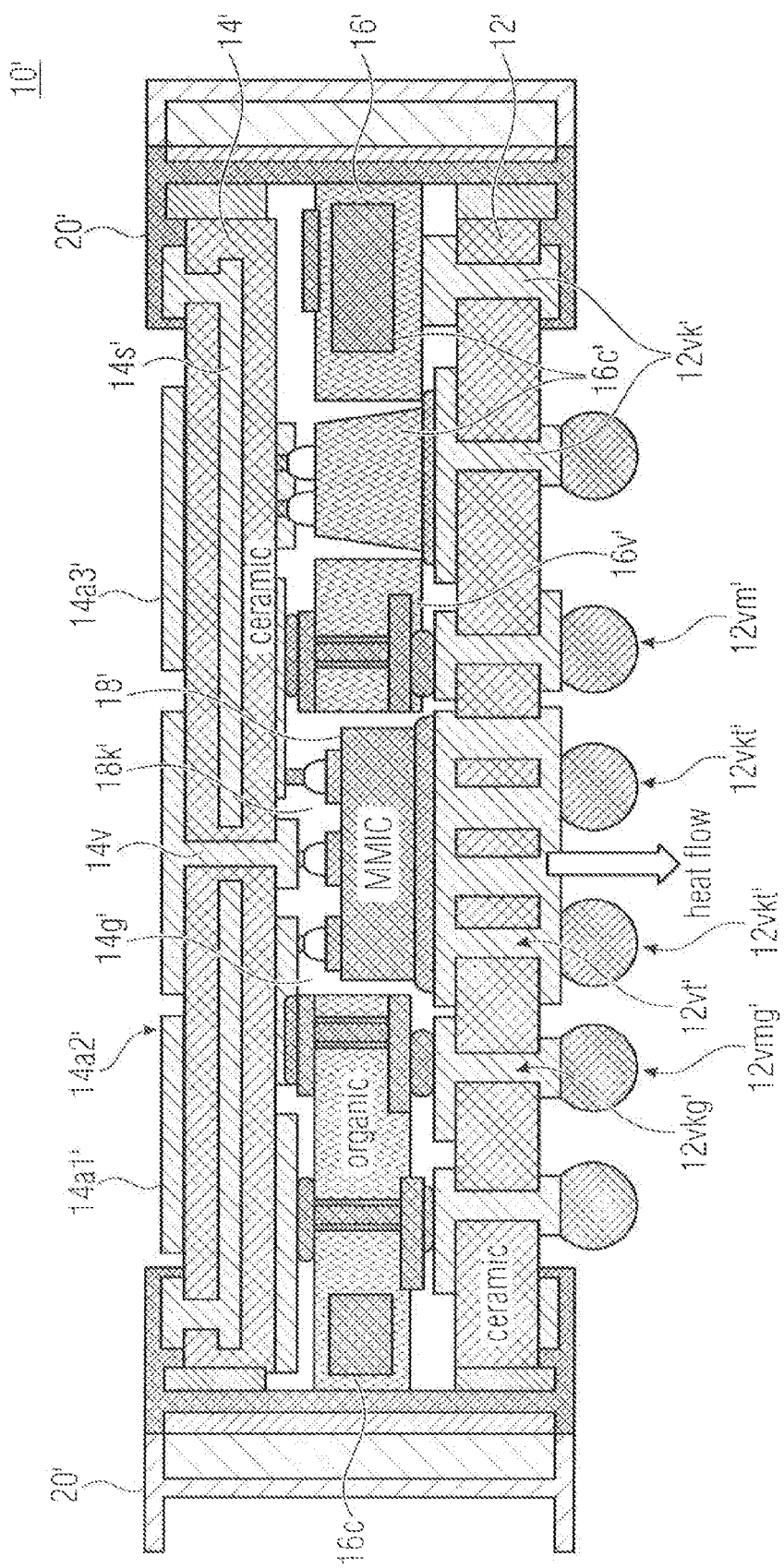
FIGS. 2a and 2b show schematic representations of module units in accordance with further embodiments.

With regard to FIG. 2a, a further embodiment will be explained below wherein additional elements are provided. FIG. 2a shows the module 10' comprising two substrates arranged one above the other, namely the antenna substrate 14' and the carrier substrate 12', which are (mechanically) coupled to each other by a spacer layer 16'. The spacer layer 16' is made on organic material, for example, and includes embedded and/or integrated components which here are referred to by the reference numeral 16c'. Additionally, vias 16v' may also be provided which connect the carrier substrate 12' to the antenna substrate 14'. The spacer layer 16' is configured, in the area of the chip (MMIC) 18' arranged on the carrier substrate 12', such that a cavity 18k' is formed between the chip 18' and the antenna substrate 14'.

With regard to the carrier substrate 12' it shall be noted that same comprises a plurality of vias 12vk' which serve the purpose of electrical contacting. Said vias may be coupled, e.g., on the outside, i.e. the main surface located opposite the first main surface, via connecting means such as solder balls 12vm'. For example, the via 12vkg' serves, in connection with the solder ball 12vmg', to connect the electrical ground.

In accordance with further embodiments, the carrier substrate 12g' may additionally comprise the vias 12vt' (thermal vias). The latter are arranged in the area of the chip 18' and serve to dissipate the heat of the chip 18' to the outside. For this purpose, in accordance with embodiments, each of said thermal vias or one of the thermal vias 12vt' may also be connected to a solder ball for thermal dissipation. Said solder balls are referred to by the reference numeral 12vkt'.

In this embodiment, the antenna substrate 14' includes several integrated antennas 14a1' to 14a3' provided on the outside of the chip module 10' (second main surface). Said antenna elements 14a1' to 14a3' are connected to the chip/IC 18' by means of a via 14v', for example. The via 14v' projects through the antenna substrate 14' as well as through the air cavity 18k' and extends as far as the IC 18' and/or is connected to the chip 18' via connecting elements.

Additionally, the antenna substrate 14' may also comprise a shielding layer 14s' arranged between the antenna plane 14a1' to 14a3' and the chip. In this embodiment, the shielding layer 14s' is embedded in the antenna substrate 14'. The shielding layer 14s' is connected to ground, as indicated, e.g., by the ground contacting element 14g'. The ground contacting element 14g' is electrically contacted with the ground via 12vkg' and/or with a ground contact of the chip 18'.

At its edges, the chip module 10' is provided with a metal plate 20' as sealing means. They demarcate the chip module in the lateral direction while also resting on the second main surface, respectively, of the carrier substrates 12' and 14' and clutch onto same, as it were. At these points, the metal piece 20' is also connected to the ground plate 12s' here via ground, in accordance with embodiments, so that shielding can be ensured.

With regard to the materials used for the module 10' it shall be noted that here, the antenna substrate 14' and the carrier substrate are formed of a ceramic material as the basic material, whereas the spacer layer 16' is formed of an organic material. In accordance with embodiments, however, it would also be feasible for the carrier substrate and/or the antenna substrates 12' and 14', respectively, to be formed of a glass material or any other insulating material advantageously comprising a low conductivity ratio and a low coefficient of thermal expansion.

Instead of the organic material in the spacer layer 16', a different material may also be used, such as a silicon material or any other material desired. With regard to the chip 18' it shall be noted that it may be formed on an Si basis or on a GaAs basis, for example.

Figure 2B:
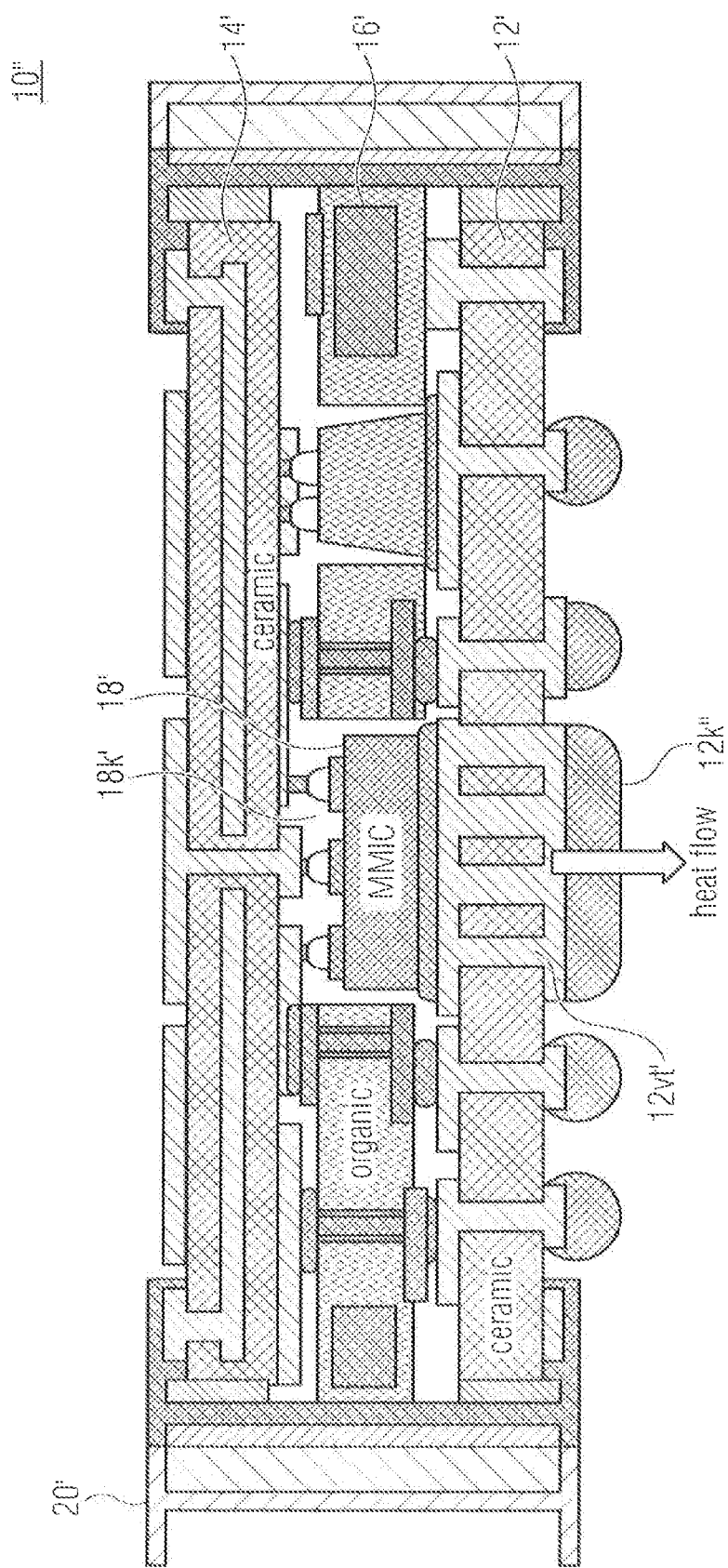

FIG. 2b shows a further embodiment, namely module 10", which essentially corresponds to the module 10', in particular with regard to the antenna substrate 14', the spacer layer 18' and the fundamental setup of the carrier substrate 12'.

In this embodiment, a heat sink 12k" is provided instead of the heat-dissipating solder balls. Said heat sink 12k" is connected to the thermal vias 12vt'.

Further variants and/or aspects, in particular with regard to manufacturing of the above-explained modules 10, 10' and 10", will be explained below.

With regard to the sealing means 20/20' it shall be noted at this point that even though they were described as being metal elements or edge metallization, they may also be sealing means of different kinds, e.g., polymer-based sealing means, of course.

With regard to the materials used for the antenna substrate 14/14' as well as the carrier substrate 12/12' it shall be noted at this point that the materials selected are advantageously highly heterogonous materials, so that a system module may be manufactured in a highly compact monolithic design. As was already explained above, ceramic substrates (the floor space being as small as possible) are suitable for this purpose, so that the upper and lower sides of the chip module may be manufactured by means of same. Here, the upper one serves to form the antenna structure, and the lower one serves for electrical contacting and for heat dissipation. Examples of ceramics are ALN, which offers very high conductivity and is therefore suitable for the carrier substrate, in particular. The upper one may be of the same material or of a different material such as $Al_2O_3$, for example. This is also highly suitable because electrical through-connections are possible. In accordance with embodiments, the ceramic substrates may comprise annular copper structures, e.g., as a stable metallic basis and/or contact for subsequent metallization (for shielding or contacts). The contacts are then achieved by, e.g., electrical through-connections extending between the planes.

With regard to the inner layer of the circuit board and/or to the spacer, it shall be noted that, as was already explained above, same may comprise electrical components in embedding technology such as individual passive elements (capacitors or the like) or integrated passive elements (e.g., filters). The inner layer of the circuit board may be manufactured in the desired shape in advance, so that a recess for the chip and the cavity is introduced (e.g., by milling) in advance. In accordance with embodiments, the outside of the inner layer (i.e. the first main surface of the antenna substrate and/or carrier substrate) is provided with electrical contact pads. For example, the inner layer may be configured such that the potential thickness corresponds to that of the embedded MMICs and/or of the general chips.

As far as the chip is concerned, it shall be noted that same may be applied onto the carrier substrate either directly or by means of a socket (in particular with very thin MMICs). Said variant is also suitable, of course, in the event of a plurality of MMICs/chips. Mutation of the MMICs on the lower ceramic layer (carrier substrate) may be effected by means of soldering or sintering. To this end, so-called stud bumpings are suited for establishing contact. Said stud bumpings may be implemented, e.g., by gold pins having lengths of 30 to 40 µm. With regard to manufacturing it shall be noted that the stud bumpings on the chip are pressed onto the contact pads provided for this purpose and/or onto the ceramic/carrier substrate while forming a gold/copper alloy (intermetallic contact).

With regard to manufacturing it shall be noted that the ceramic substrates (antenna substrate and carrier substrate) as well as the inner layer (spacer) are advantageously laminated in order to produce the mechanical connection. To this end, the ceramics of the inner layers of the circuit board are covered with a very thin prepack (glass fiber-reinforced epoxide), which comprises a cavity just like the inner layer. During lamination, the internal IC does not have the epoxide resin flowing around it so as to maintain the air cavity for the time after the manufacturing process. Following lamination, the modules may be largely, but not fully, milled out of the circuit board. Here it is also feasible for the ceramic surfaces to be covered by a photoresist. Subsequently, edge metallization of the modules is performed up to the copper ring on the ceramics so as to hermetically close the module (metal sealing+ceramics with electrical leadthroughs).

With regard to the cavity located above the MMIC it shall be noted that said cavity inside the module may also be evacuated, for example by providing an open through-connection within one of the ceramics/substrates, via which the module will then be evacuated within a vacuum chamber. The open through-connection will then be closed by means of a solder following evacuation and/or within the vacuum chamber.

Even though the above embodiments were explained in particular with regard to module 10/10'/10", it shall be noted that a corresponding manufacturing method is also provided. Said manufacturing method includes the steps of providing a carrier substrate and an antenna substrate, providing an inner layer and/or a spacer via which the carrier substrate is connected to the antenna substrate. In accordance with embodiments, the chip is provided on or within the carrier substrate in advance. In accordance with further embodiments, the antenna substrate is provided with the antenna structures in advance. In accordance with embodiments, through-connection may also be introduced during manufacturing of the antenna substrate/carrier substrate. As was explained above, in accordance with embodiments, a prepeg layer, which is milled out, or, generally, recessed for the cavities just like the spacer, may be used for connecting the individual components to one another. In accordance with an additional embodiment, the manufacturing method includes the step of applying sealing means in the edge area following connection of the antenna substrate and the carrier substrate so as to facilitate hermetic contacting. All steps are performed such that the cavity is preserved during and after the manufacturing process.

It shall once again be noted at this point that it goes without saying that descriptions of a method step evidently also represent a description of the respective structural element, and vice versa.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Module unit comprising:
a carrier substrate comprising at least one chip arranged on a first main surface and a spacer arranged on the first main surface;
an antenna substrate comprising at least one antenna structure; and
sealants which hermetically seal the antenna substrate, the spacer and the carrier substrate toward an outside;
the antenna substrate being connected to the carrier substrate by means of the spacer so that a cavity is formed between the chip and the antenna substrate;
wherein the spacer is formed by a socket.

2. Module unit as claimed in claim 1, wherein the antenna substrate and the carrier substrate are non-conductive.

3. Module unit as claimed in claim 1, wherein the antenna substrate and the carrier substrate comprise a ceramic material and/or a glass material.

4. Module unit as claimed in claim 1, wherein the antenna structure is embedded into the antenna substrate or is arranged on the antenna substrate on an outside of the module unit.

5. Module unit as claimed in claim 1, wherein the antenna substrate comprises a shielding plane between the antenna structure and the chip.

6. Module unit as claimed in claim 1, wherein the chip is connected to the antenna structure by means of vias or electromagnetic couplers.

7. Module unit as claimed in claim 6, wherein the via projects through the cavity or through the cavity and the antenna substrate.

8. Module unit as claimed in claim 1, wherein the carrier substrate comprises vias or through-connections for electrically contacting the chip.

9. Module unit as claimed in claim 1, wherein the carrier substrate comprises vias in the area of the chip which are configured to dissipate heat of the chip.

10. Module unit as claimed in claim 8, wherein the carrier substrate comprises contact elements on outside of the module unit.

11. Module unit as claimed in claim 9, wherein the carrier substrate comprises, on an outside of the module unit, thermal balls, a heat sink and/or cooling agents which are connected to the vias.

12. Module unit as claimed in claim 1, wherein the spacer comprises embedded components.

13. Module unit as claimed in claim 1, wherein the module is hermetically closed by sealants.

14. Module unit as claimed in claim 1, wherein the spacer is locally connected, electrically and mechanically, to the antenna substrate and/or to the carrier substrate.

* * * * *